United States Patent
Kuo et al.

[11] Patent Number: 5,973,514
[45] Date of Patent: Oct. 26, 1999

[54] 1.5V BOOTSTRAPPED ALL-N-LOGIC TRUE-SINGLE-PHASE CMOS DYNAMIC LOGIC CIRCUIT SUITABLE FOR LOW SUPPLY VOLTAGE AND HIGH SPEED PIPELINED SYSTEM OPERATION

[75] Inventors: James B. Kuo; Jea-Hong Lou, both of Taipei, Taiwan

[73] Assignee: National Science Council, Taipei, Taiwan

[21] Appl. No.: 08/977,076

[22] Filed: Nov. 24, 1997

[30] Foreign Application Priority Data

Jun. 3, 1997 [TW] Taiwan ................................. 86107557

[51] Int. Cl.[6] ............................................. H03K 19/096
[52] U.S. Cl. .............................. 326/98; 326/88; 326/121; 327/390
[58] Field of Search ......................... 326/93, 95, 98, 326/112, 119, 121, 17, 83; 327/390, 589

[56] References Cited

U.S. PATENT DOCUMENTS 5,525,916  6/1996  Gu et al. ..................................... 326/98
5,559,452  9/1996  Saito ........................................... 326/88
5,594,380  1/1997  Nam ............................................ 326/88
5,898,333  4/1999  Kuo et al. ................................... 326/88

OTHER PUBLICATIONS

Lou et al., "A 1.5–V Full–Swing Bootstrapped CMOS Large Capacitive–Load Driver Circuit Suitable for Low–Voltage CMOS VLSI", IEEE J. of Solid–State Circuits, vol. 32, No. 1, pp. 119–121, Jan. 1997.

*Primary Examiner*—Jon Santamauro
*Attorney, Agent, or Firm*—Fish & Richardson P.C.

[57] ABSTRACT

This invention presents an all-N-logic true-single-phase CMOS dynamic logic circuit for high speed operation with a low supply voltage, in which a bootstrapped circuit containing a bootstrap capacitor, an inverter and a PMOS transistor is incorporated to a conventional non-inverting N1-block.

2 Claims, 10 Drawing Sheets

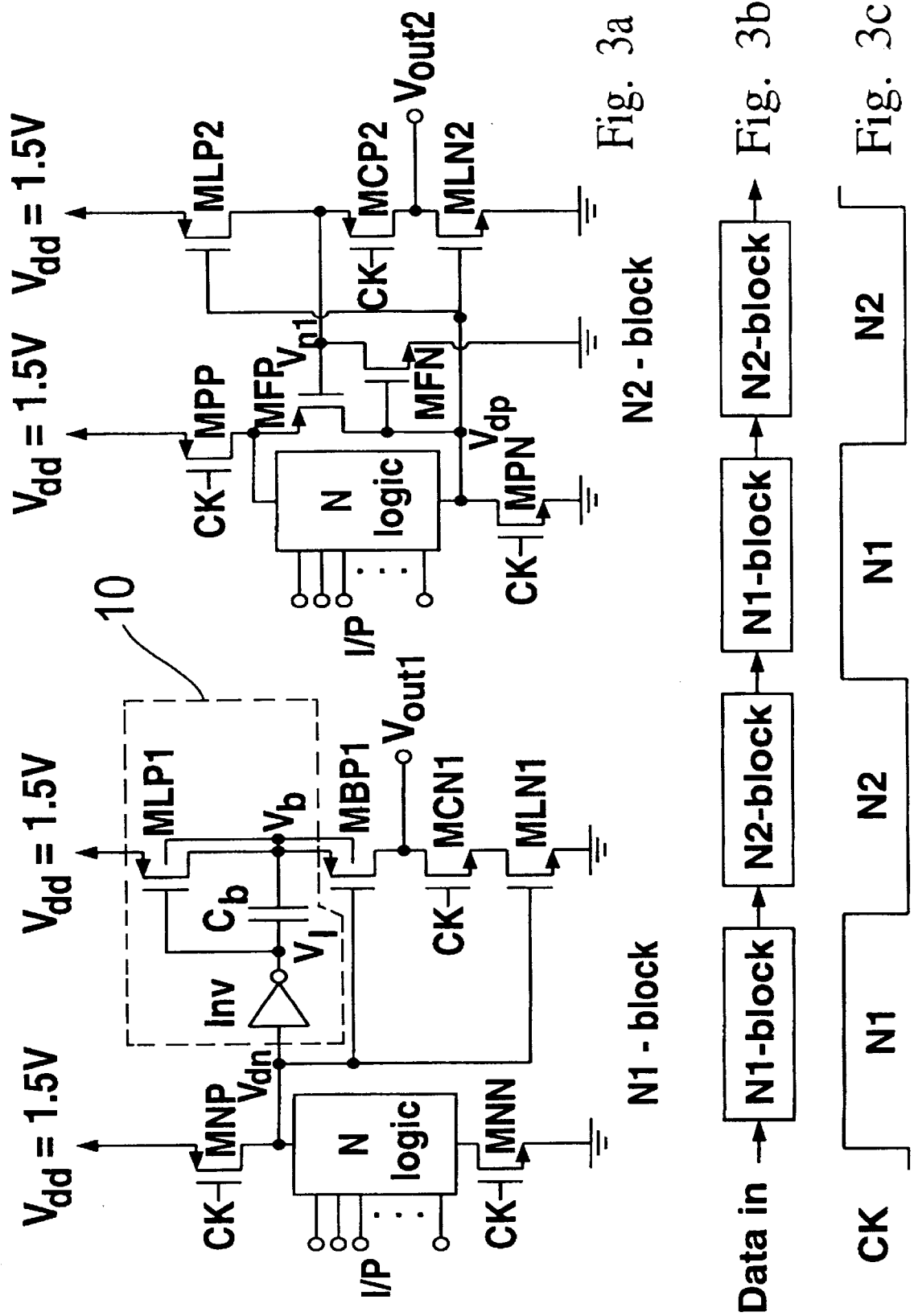

1.5V BOOTSTRAPPED ALL-N-LOGIC TRUE-SINGLE-PHASE CMOS DYNAMIC LOGIC CIRCUIT SUITABLE FOR LOW SUPPLY VOLTAGE AND HIGH SPEED PIPELINED SYSTEM OPERATION

INTRODUCTION

For next-generation CMOS VLSI circuits, low supply voltage is the trend. Since the threshold voltages of the CMOS devices cannot be scaled down accordingly with the supply voltage, how to design a CMOS dynamic circuit using a low supply voltage for the next-generation CMOS VLSI is a challenge. CMOS dynamic logic circuit techniques have been used to enhance the speed performance of VLSI pipelined systems. However, CMOS dynamic logic circuits may have disadvantages in race and charge sharing problems. In addition, clocks with a complicated timing may be required. In NORA [N. F. Gonzalves and H. J. DeMan, "NORA: A Racefree Dynamic CMOS Technique for Pipelined Logic Structures," IEEE J. Solid-State Circuits, Vol. 18, No.3, pp. 261–266, June 1983], true-single-phase [Y. Jiren and C. Svensson, "High Speed CMOS Circuit Technique," IEEE J. Solid-State Circuits, Vol. 24, pp. 62–70, February 1989] and Zipper CMOS [C. M. Lee and E. W. Szeto, "Zipper CMOS," IEEE Circuits and Devices, pp. 261–266, May 1986] dynamic logic circuits, the PMOS logic blocks may limit the speed performance. In Zipper CMOS dynamic logic circuits, dc power consumption is required. In the four-phase dynamic logic circuits [C. Y. Wu. K. H. Cheng, and J. S. Wang, "Analysis and Design of a New Race-Free Four-Phase CMOS Logic," IEEE J. Solid-State Circuits, Vol. 28, pp. 18–25, January 1993], a complicated clock distribution strategy is mandatory. A single-phase CMOS dynamic circuit using all N-logic has been reported [Richard X. Gu and Mohamed I. Elmasry, "All-N-Logic High-Speed True-Single-Phase Dynamic CMOS Logic," IEEE J. Solid-State Circuits, Vol. 31, No. 2, pp. 221–229, February 1996; U.S. Pat. No. 5,525,916, June. 1996]. However, it is not suitable for low voltage operation. In this invention, using the bootstrap circuit technique [J. H. Lou and J. B. Kuo, "A 1.5 V Full-Swing Bootstrapped CMOS Large Capacitive-Load Driver Circuit Suitable for Low-Voltage CMOS VLSI," IEEE J. Solid-State Circuits, Vol. 32, No. 1, January 1997; "A 1.5 V Full-Swing Bootstrapped CMOS Large Capacitive-Load Driver Circuit Suitable for Low-Voltage Deep-Submicron CMOS VLSI," US patent application serial No. 08/627,482, filed Apr. 4, 1996, now U.S. Pat. No. 5,729,165 ], an all-N-logic true-single-phase CMOS dynamic logic circuit suitable for operation with a low supply voltage is described. In the following sections, the background of the CMOS dynamic logic circuit is reviewed first, followed by the operation principles of the new 1.5 V bootstrapped all-N-logic true-single-phase CMOS dynamic logic circuit and the performance evaluation.

Background of the CMOS Dynamic Logic Circuits

CMOS dynamic logic circuits can provide high speed performance for pipelined VLSI systems. However, CMOS dynamic logic circuits may suffer from race and charge sharing problems. In addition, the clocks required in a CMOS dynamic logic circuit may be complicated. During the evolution of the CMOS dynamic logic circuits, the complexity of the clock timing required in the CMOS dynamic logic circuits is reduced. In the following subsections, the evolution of the CMOS dynamic logic circuits is described in terms of NORA and the true-single-phase dynamic logic circuits.

NORA

FIG. 1 shows a NORA (no race) CMOS dynamic logic circuit used in pipelined systems. In NORA CMOS dynamic logic circuits, there are two basic cells: the N-logicand the p-logic cells. In addition, a clocked CMOS latch is required. The operation of the NORA CMOS dynamic logic circuit is divided into two periods: 1. the precharge period and 2. the logic evaluation period. During the precharge period, the output of the N-logic cell is pulled up to high and that of the p-logic cell is pulled down to low. During the logic evaluation, the output of the N-logic cell may stay high or may be pulled low depending on the input signals to the N-logic circuit. Similarly, the output of the p-logic cell may stay low or may be pulled high depending on the input signals to the plogic circuit. In order to expedite the pre-charge and the logic evaluation periods, two non-overlapping clocks (CK and $\overline{CK}$) are required. By the n-p-n-p cell arrangement, the race problem can be avoided. However, a clocked CMOS latch is required at the output. Hence, an extra gate delay due to the clocked CMOS latch may degrade the speed performance. In addition, due to a smaller hole mobility, the slower p-logic circuit may degrade the speed performance of the overall circuit. Although using the domino logic circuit [R. H. Krambeck, C. M. Lee, and H. -S. Law, "High-Speed Compact Circuits with CMOS," IEEE J. Solid-State Circuits, Vol. 17, pp. 614–619, June 1982], the p-logic circuit can be avoided. However, two non-overlapping clocks are still necessary. In the NORA circuit, two non-overlapping clocks (CK and $\overline{CK}$) are needed. When the clock lines are long, the skewing of the clocks may make the clocks overlapping. As a result, an erroneous result at the output of the clocked CMOS latch may be produced. The clock skewing problem is especially serious when the supply voltage is scaled down since the driving capability of the CMOS devices is reduced for a down-scaled supply voltage.

True-Single-Phase

FIGS. 2a and 2b show the true-single-phase CMOS dynamic logic circuits of Jiren and Svensson: N-block and P-block. Compared to NORA and domino logic circuits, a single-phase clock is needed. As a result, clock skewing problems as in the NORA circuits can be completely avoided. No clocked CMOS latches are required in the true-single-phase CMOS dynamic logic circuit. Instead, in the n- or the P-block, it is composed of the input logic branch followed by the output latch branch. In addition, the circuit configuration of the n- and the p- blocks is complementary. In the N-block, the internal node output $V_{dn}$ is between the PMOS device MNP and the N-logic input branch. In the P-block, the internal node output $V_{dp}$ is between the NMOS device MPN and the p-logic input branch.

In the true-single-phase CMOS dynamic logic circuits, the n-p-n-p block arrangement is necessary. The operation of the true-single-phase CMOS dynamic logic circuit is also divided into two periods: the precharge period and the logic evaluation period. Different from the NORA circuit, in a true-single-phase CMOS dynamic logic circuit, if N-blocks (P-blocks) are in the precharge period, the P-blocks (N-blocks) must be in the logic evaluation period. During the precharge period, the internal node voltages $V_{dn}$, $V_{dp}$ of the N-block and the P-block are precharged to high and low, respectively. During the precharge period, the output of the n- and the P-blocks is floating—the previous states are maintained at the output nodes. During the logic evaluation period, depending on the input signals, the internal node $V_{dn}$, of the N-block may be pulled low. If the input signals to the N-block are all high, the internal node $V_{dn}$ will be pulled low, therefore, the output $V_{outn}$ will be pulled high. P-block has a complementary scheme. During the logic evaluation period, the internal node $V_{dp}$ of the P-block will be pulled high if all input signals are low. Under this Situation, the output $V_{outp}$ of the P-block will be pulled low. By the single-phase clock arrangement, the clock skewing problems have been avoided. However, the slower speed of the P-block due to the smaller hole mobility degrades the overall speed performance.

SUMMARY

This invention presents an all-N-logic true-single-phase CMOS dynamic logic circuit for high speed operation with a low supply voltage, in which a bootstrapped circuit containing a bootstrap capacitor, an inverter and a PMOS transistor is incorporated to a conventional non-inverting N1-block.

The improved non-inverting all-N-logic true-single-phase CMOS dynamic circuit for operation in response to receiving a single-phase clock signal comprises a) a first PMOS transistor (MNP) having a gate terminal, a drain terminal and a source terminal, said source terminal being connected to a positive power ($V_{dd}$), and said gate terminal being connected to a source of said single-phase clock signal (CK);

b) a second PMOS transistor (MBP1) having a gate terminal, a drain terminal and a source terminal, said gate terminal being connected to the drain terminal of said first PMOS transistor (MNP);

c) a first NMOS transistor (MNN) having a gate terminal, a drain terminal and a source terminal, said source terminal being earthed, and said gate terminal being connected to said source of said single-phase clock signal;

d) N logic switch means connected to the drain terminal of said first PMOS transistor (MNP) and the drain terminal of said first NMOS transistor (MNN), for selectively connecting and disconnecting said drain terminal of said first PMOS transistor and said drain terminal of said first NMOS transistor;

e) a second NMOS transistor (MLN1) having a gate terminal, a drain terminal and a source terminal, said source terminal being earthed or connected to the drain terminal of said first NMOS transistor (MNN), and said gate terminal being connected to the drain terminal of said first PMOS transistor (MNP);

f) a third NMOS transistor (MCN1) having a gate terminal, a drain terminal and a source terminal, said source terminal being connected to the drain terminal of said second NMOS transistor (MLN1), said gate terminal being connected to said source of said single-phase clock signal, and said drain terminal being connected to the drain terminal of said second PMOS transistor (MBP1) and an output terminal;

g) a capacitor device ($C_b$) having a bottom plate and a top plate;

h) an inverter having an input terminal and output terminal; and i) a third PMOS transistor (MLP1) having a gate terminal, a drain terminal and a source terminal, wherein said source terminal of said third PMOS transistor (MLP1) is connected to said positive power ($V_{dd}$);

said input terminal of said inverter is connected to said drain terminal of said first PMOS transistor (MNP);

said drain terminal of said third PMOS transistor (MLP1) and said source terminal of said second PMOS transistor (MBP1) are both connected to said bottom plate of said capacitor device; and said gate terminal of said third PMOS transistor (MLP1) and said top plate of said capacitor device are both connected to said output terminal of said inverter.

Said capacitor device may be realized as a fourth PMOS transistor having a drain terminal, a source terminal and a gate terminal, the drain terminal and source terminal of said fourth PMOS transistor being connected with each other, wherein the connected drain terminal and source terminal of said fourth PMOS transistor are connected to said drain terminal of said third PMOS transistor (MLP1) and to said source terminal of said second PMOS transistor (MBP1) as said bottom plate, and said gate terminal of said fourth PMOS transistor is connected to said output terminal of said inverter as said top plate of said capacitor device.

A true-single-phase CMOS dynamic logic circuit using all-N-logic and bootstrapped circuit techniques for high speed operation with a low supply voltage constructed according to the present invention has a speed performance 75% faster at a supply voltage of 1.5 V as compared to the conventional true-single-phase dynamic logic circuit.

BRIEF DESCRIPTION OF THE DRAWINGS

FIG. 2a shows a schematic diagram of a true-single-phase (TSP) CMOS dynamic logic circuit using the n-p-n-p configuration disclosed in the prior art.

FIG. 2b shows a clock signal diagram for the circuit in FIG. 2a.

FIG. 3a shows a schematic diagram of a bootstrpped all-N-logic true-single-phase (TSP) CMOS dynamic logic circuit using the 1.5 V supply voltage according to the present invention.

FIG. 3b shows a schematic block diagram of the circuit in FIG. 3a.

FIG. 3c shows a clock signal diagram for the circuit in FIG. 3a.

FIG. 4a shows a schematic diagram of 3-input NAND circuit using the 1.5 V bootstrapped all-N-logic true-single-phase CMOS dynamic logic circuit in FIG. 2a.

FIG. 5a shows the rise time of the N1-block vs. fan-in of the 1.5 V all-N-logic true-single-phase (TSP) CMOS dynamic logic circuit as shown in FIG. 3a in comparison with the rise time of the N-block of the TSP CMOS dynamic logic circuit using the n-p-n-p configuration as shown in FIG. 2a.

FIG. 5b shows the fall time of the N2-block vs. fan-in of the 1.5 V all-N-logic true-single-phase (TSP) CMOS dynamic logic circuit as shown in FIG. 3a in comparison with the fall time of the P-block of the TSP CMOS dynamic logic circuit using the n-p-n-p configuration as shown in FIG. 2a.

FIG. 6a shows the rise time of the N1-block vs. supply voltage of the 1.5 V all-N-logic true-single-phase (TSP) CMOS dynamic logic circuit in comparison with the rise time of the N-block of the TSP CMOS dynamic logic circuit using the n-p-n-p configuration as shown in FIG. 2a.

FIG. 6b shows the fall time of the N2-block vs. supply voltage of the 1.5 V all-N-logic true-single-phase (TSP) CMOS dynamic logic circuit with the bootstrap circuit in FIG. 3a (continuous solid line) and without the bootstrap circuit (broken line) in comparison with the fall time of the P-block (dot line) of the TSP CMOS dynamic logic circuit using the n-p-n-p configuration as shown in FIG. 2a.

DETAILED DESCRIPTION OF THE PREFERRED EMBODIMENTS 1.5 V Bootstrapped All-N-Logic True-Single-Phase CMOS Dynamic Logic Circuit FIGS. 3a to 3c show the 1.5 V bootstrapped all-N-logic true-single-phase CMOS dynamic logic circuits: the N1-block and the N2-block, where the P-block as described in the previous subsection has been replaced by the N2-block using the all-N-logic true-single-phase technique [Richard X. Gu and Mohamed I. Elmasry, "All-N-Logic High-Speed True-Single-Phase Dynamic CMOS Logic," IEEE J. Solid-State Circuits, Vol. 31, No. 2, pp. 221–229, February 1996; U.S. Pat. No. 5,525,916, June 1996], details of which are incorporated by reference. The N1-block is identical to the N-block as described in FIG. 2a except that a bootstrap circuit 10 containing a bootstrap capacitor $C_b$ has been added. In the N1-block, when CK is low, MNN is off, $V_{dn}$ node is separated from the ground, and the N-logic in N1-block has no influence on $V_{dn}$. Under this situation, the $V_{dn}$ node is precharged to $V_{dd}$ since MNP is on. Therefore, the internal node $V_1$, between the inverter Inv and the bootstrap capacitor $C_b$, is low, hence MLP1 is on and $V_b$ is charged to high. At this time, in the bootstrap capacitor $C_b$ an amount of charge $C_b V_{dd}$ is stored. Since both MBP1 and MCN1 are off, the output $V_{out1}$ is isolated from $V_b$ and the drain of MLN1, so the output $V_{out1}$ of N1-block keeps its previous state. When CK is high, MNP is off and MNN is on. Therefore, when all input signals to the N1-block are high, the internal node voltage $V_{dn}$ is pulled low, thus $V_1$ switches from low to high and MLP1 is off and MBP1 is on. Due to the charge stored in the bootstrap capacitor, $V_b$ is bootstrapped to exceed $V_{dd}$. Since MBP1 is on, therefore, the output voltage of the N1-block will be pulled up to a value $V_{out1}$, which may exceed $V_{dd}$. Owing to the N1-N2-N1-N2 block arrangement, the bootstrapped output of the N1-block may help drive the following N2-block. Note that the N2-block is used to replace the P-block in FIG. 2a. When CK is high, MPP is off, therefore the N-logic of the N2-block is separated from $V_{dd}$. At the same time, the $V_{dp}$ node is predischarged to ground since MPN is on. Under this situation, the output of N2-block $V_{out2}$ keeps its previous state since both MCP2 and MLN2 are off. So the Output $V_{out2}$ is isolated from $V_{n1}$ and ground, and $V_{out2}$ keep its previous state. When CK is low, MPP turns on and MPN is off—the logic evaluation period. If all inputs to the N2-block are high, $V_{dp}$ is pulled high to $V_{dd}-V_{tn}(V_{dp})$, where $V_{tn}(V_{dp})$ is the threshold voltage of the NMOS device when its source voltage is $V_{dp}$ due to the body effect of the NMOS device. Therefore, MLN2 turns on, hence, the output Voltage $V_{out2}$ is pulled low. The switching speed of $V_{out2}$ and the stability of the $V_{dp}$ level can be improved by raising the $V_{dp}$ level by MFN and MFP. When MLN2 turns on, MFN also turns on, which pulls the node voltage $V_{n1}$ to ground. Thus, MFP turns on and $V_{dp}$ is pulled high to $V_{dd}$. If N-logic of N2-block does not turn on, the $V_{dp}$ is still low and MLP2 still turns on. The $V_{out2}$ remains high since MCP2 and MLP2 are on.

The N1-N2-N1-N2 block arrangement is required for the all-N-logic true-single-phase CMOS dynamic logic circuit. When the N1-blocks are in the precharge period, the N2-blocks are in the logic evaluation period. With the bootstrap circuit in the N1-block, the output of the N1-block may exceed $V_{dd}$. Therefore, the internal voltage $V_{dp}$ of the following N2-block can be raised to $V_{out1}-V_{tn}(V_{dp})$. As a result, the output voltage can be discharged faster by an enhanced current drive of the MLN2. In the N1-block, the extent of $V_b$ surpassing $V_{dd}$—the internal voltage overshoot is dependent on $C_b$ and the equivalent load capacitance at the output node. In this design, considering a fan-out of two, the equivalent load capacitance is 25 fF at the output node. Using a $C_b$ of 350 fF, during the bootstrap operation, $V_b$ surpasses 1.5 V by 0.5 V. A higher internal voltage overshoot may bring in a greater improvement in speed performance. In the CMOS bootstrap circuit, the body of MLP1 & MBP1 is connected to $V_b$, instead of $V_{dd}$. Therefore, the internal voltage overshoot at $V_b$ does not cause the forward bias of the source/drain-substrate junction.

Performance Evaluation

Figure 4A:
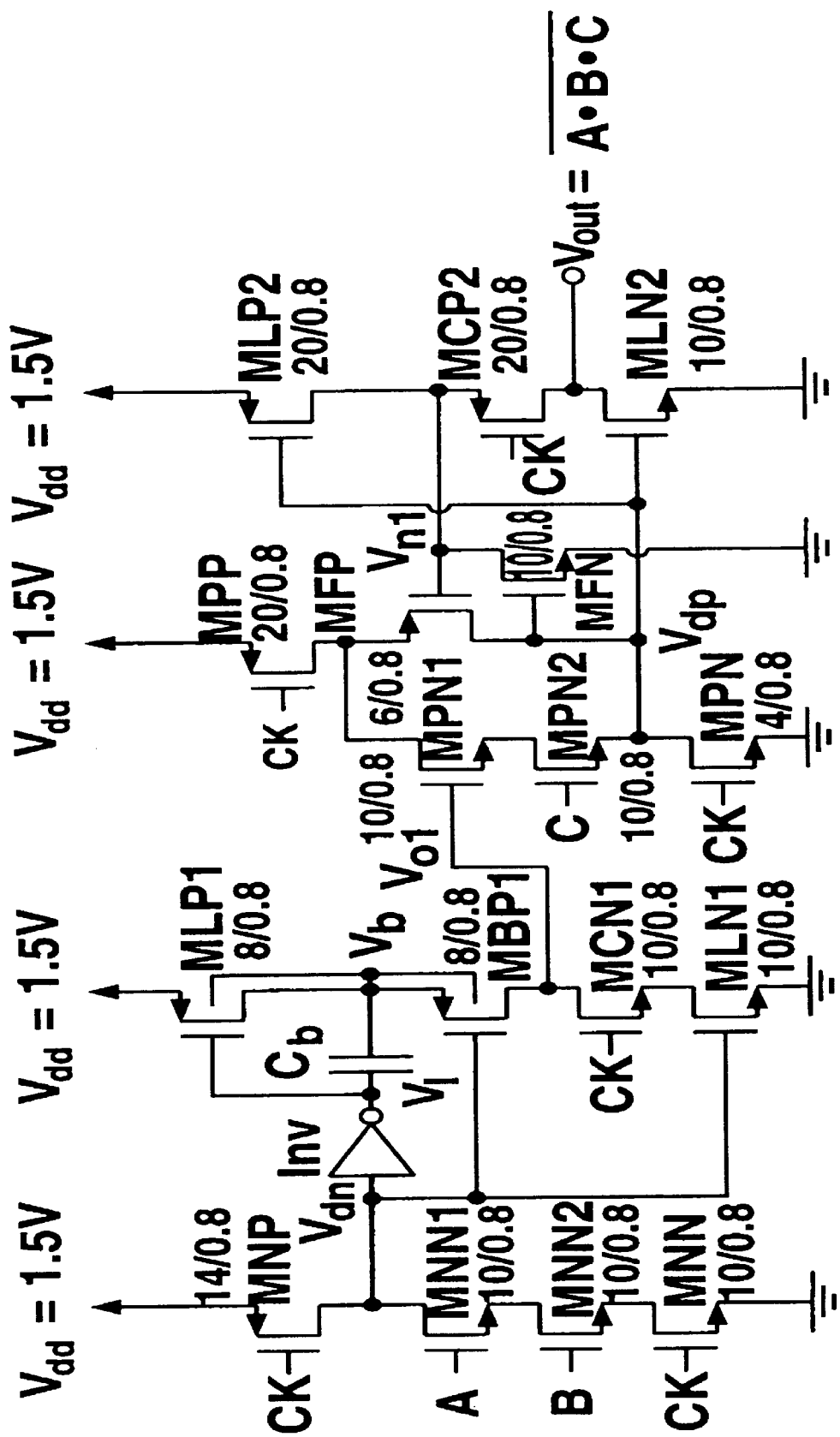
Figure 4B:
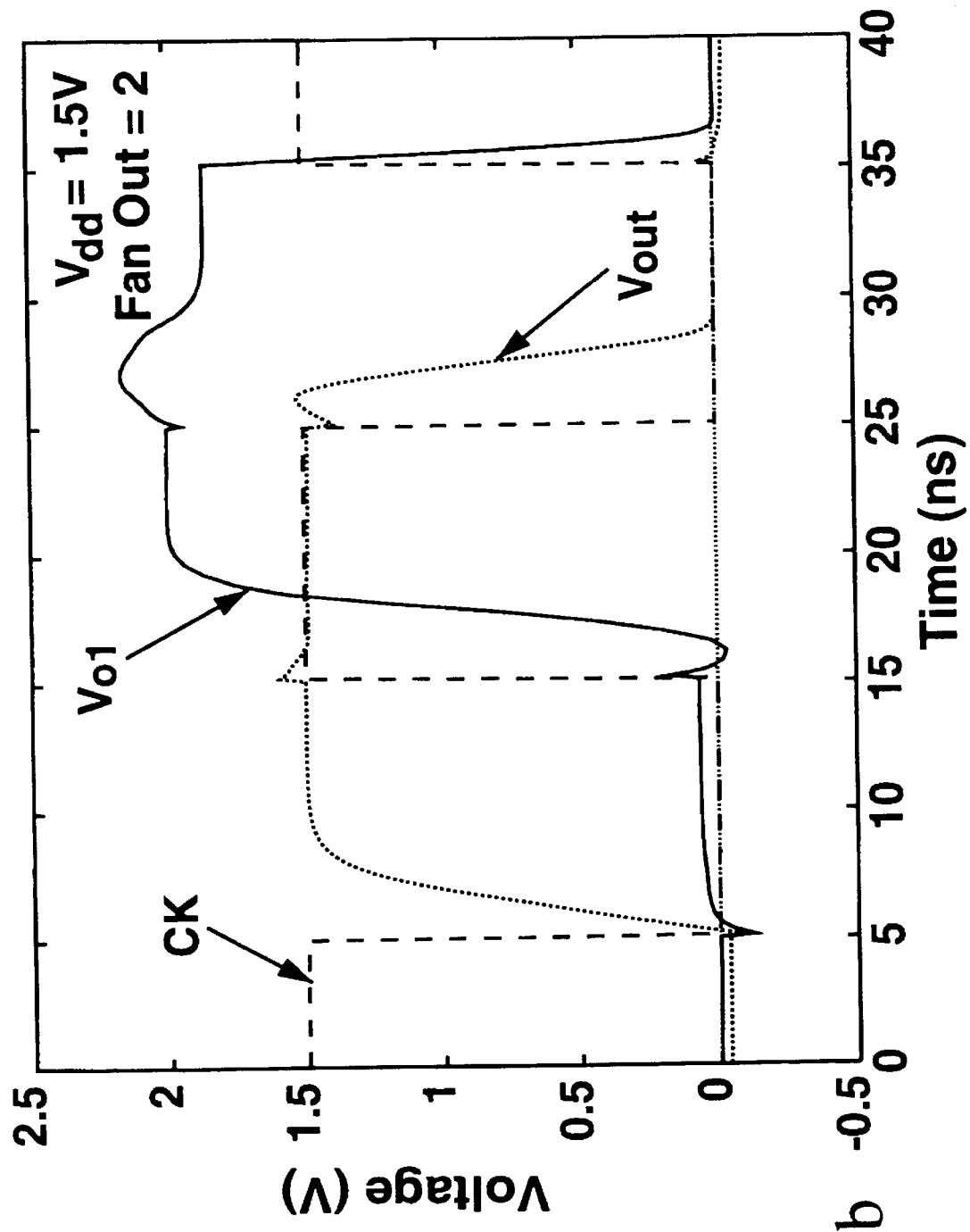
FIG. 4b is a time vs. voltage plot showing the clock signal (CK) and transients of the bootstrapped 1.5 V all-N-logic true-single-phase (TSP) CMOS dynamic logic circuit at nodes $V_{o1}$ and $V_{out}$.
Figure 4C:
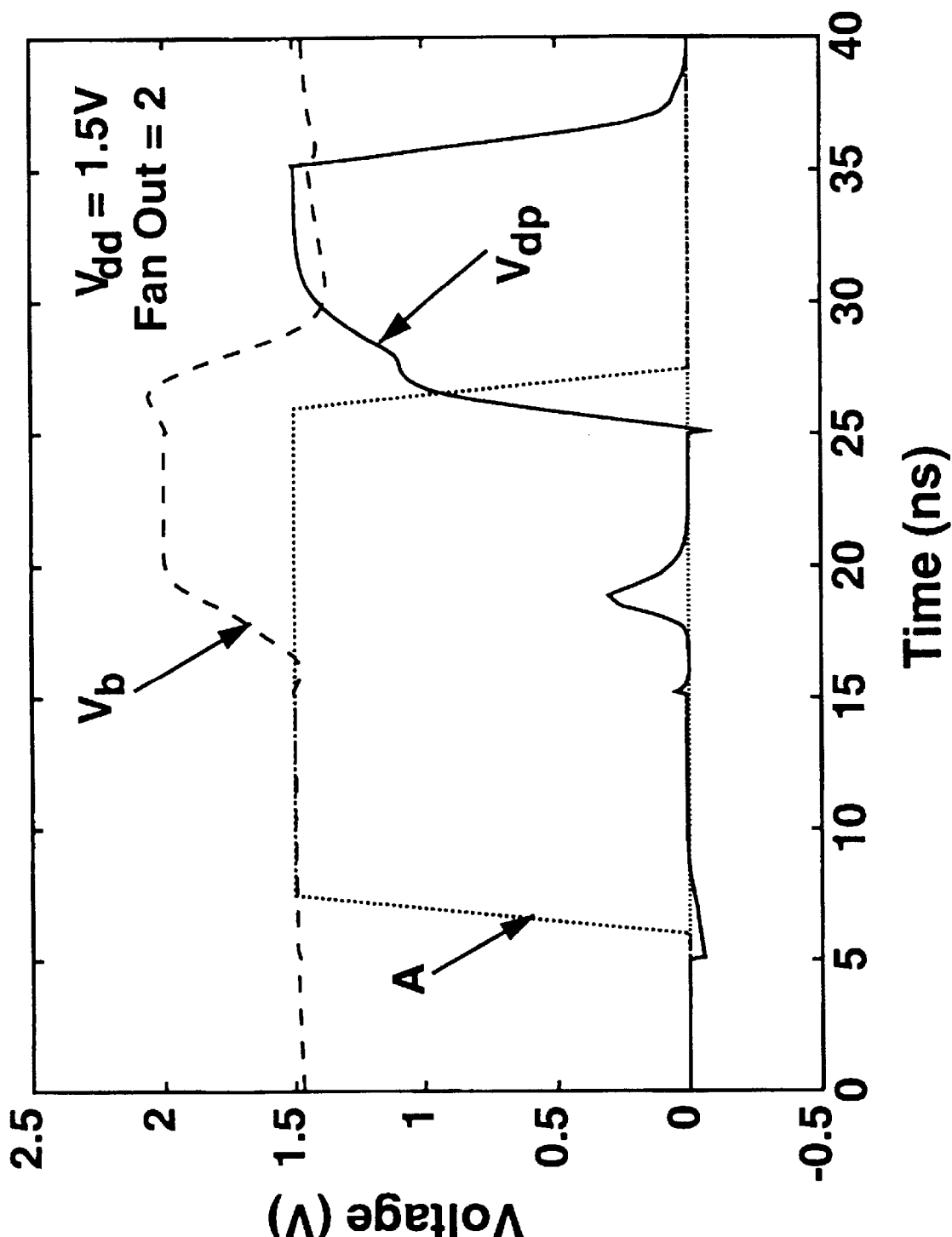
FIG. 4c is a time vs. voltage plot showing the input signal A and transients of the bootstrapped 1.5 V all-N-logic true-single-phase (TSP) CMOS dynamic logic circuit at nodes $V_b$ and $V_{dp}$.

In order to evaluate the performance of the 1.5 V bootstrapped all-N-logic true-single-phase CMOS dynamic logic circuit, a 3-input NAND circuit as shown in FIG. 4a has been designed. It's worth pointing out that the N1-block is non-inverting and the N2-block is inverting. At the output of the N1-block, it is $V_{o1}=A \cdot B$. At the output of the N2-block, it is $V_{out}=\overline{V_{o1} \cdot C}=\overline{A \cdot B \cdot C}$. Based on the aspect ratio for each device as listed in FIG. 4a, FIGS. 4b and 4c show the transient waveforms of the circuit as shown in FIG. 4a. As shown in the figures, when CK is high, the output of the N1-block ($V_{o1}$) is bootstrapped to exceed 1.5 V. Therefore, the internal node voltage $V_{dp}$ of the N2-block can be pulled up at a higher speed, thus the output of the N2-block can be pulled down at a faster speed.

Figure 1:
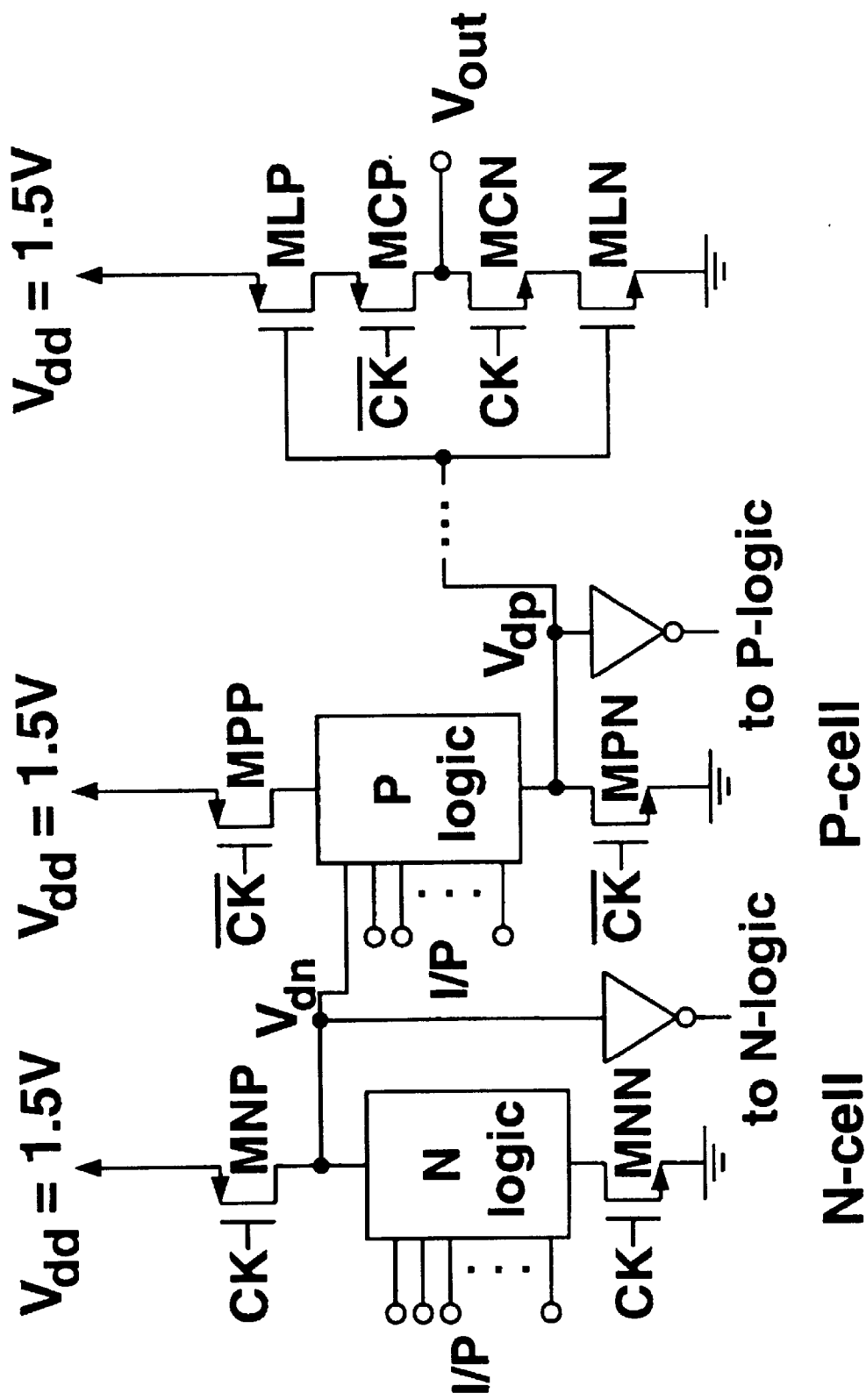
FIG. 1 shows a block diagram of a prior art NORA CMOS dynamic logic circuit used in a pipelined system.
Figures 2A, 2B:
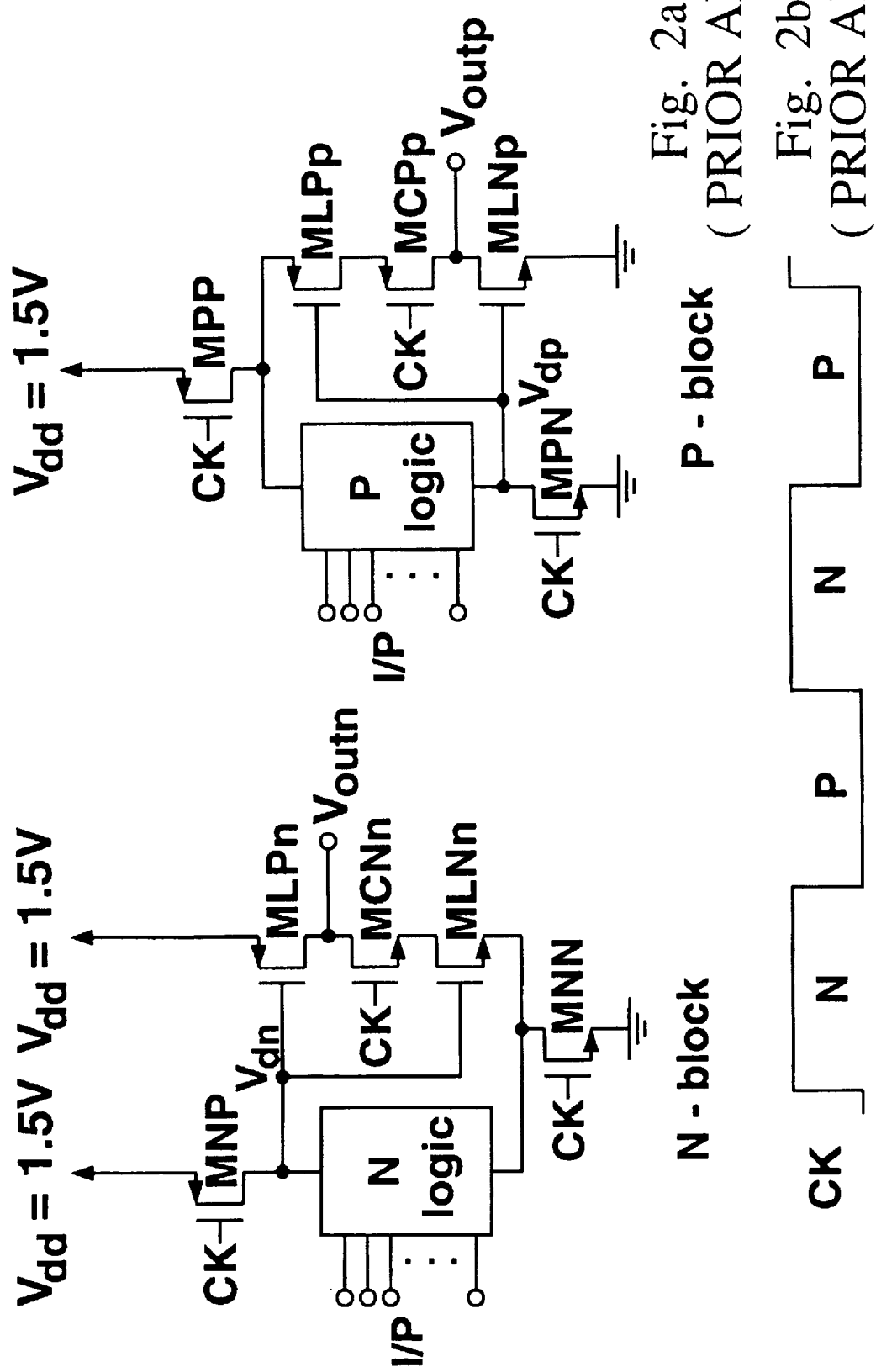
Figure 5A:
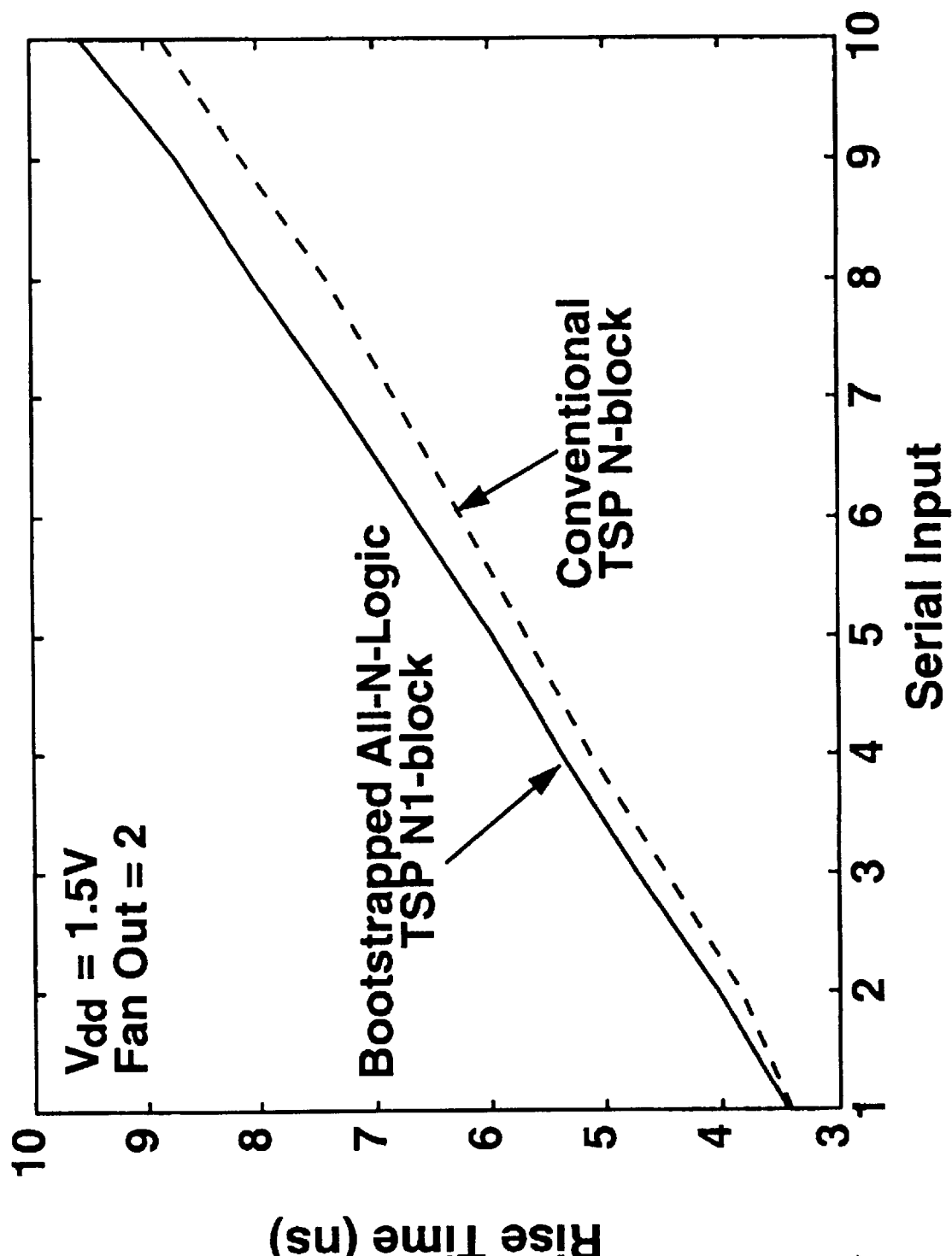
Figure 5B:
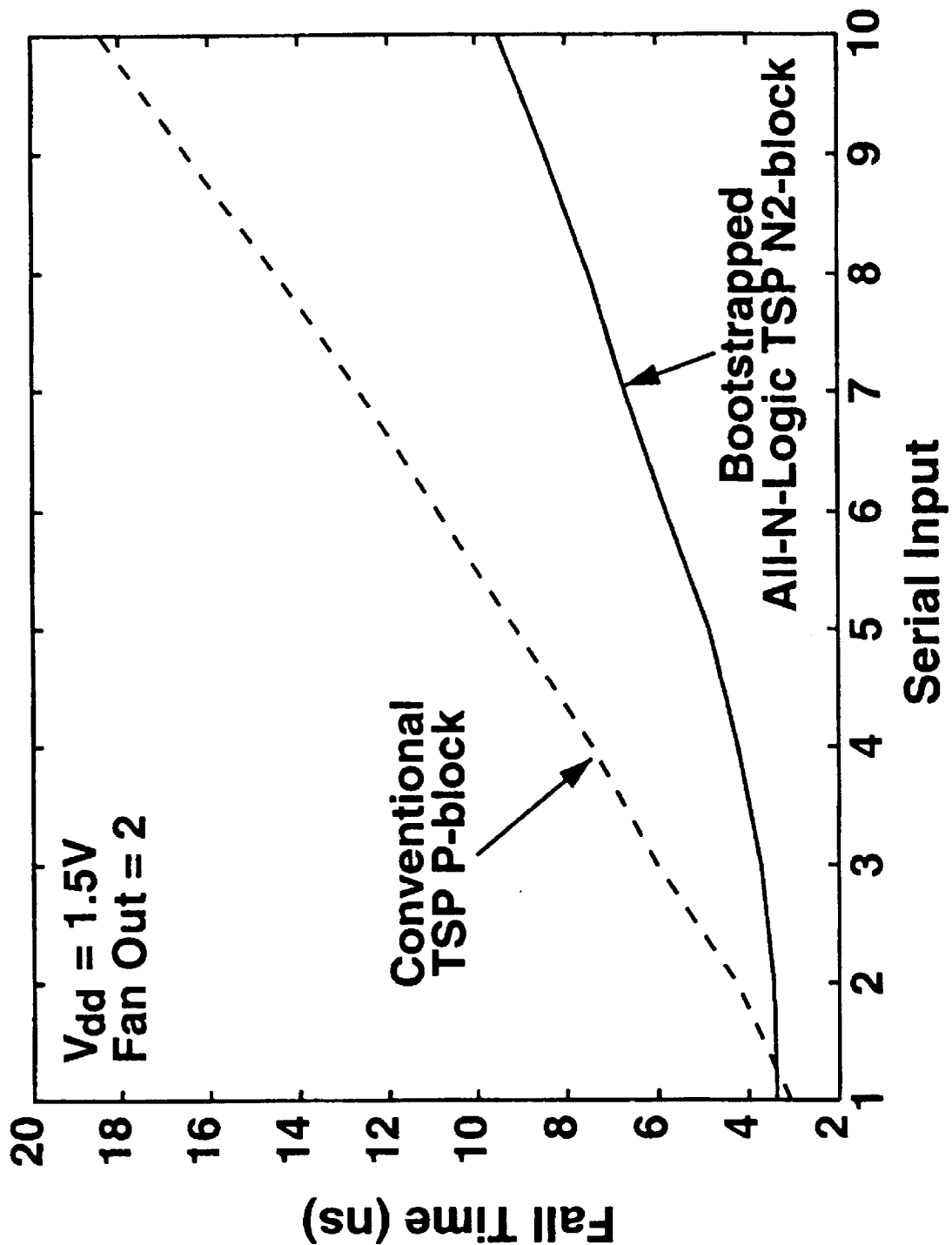

FIG. 5a shows the rise time of the N1-block vs. fan-in of the 1.5 V boostrapped all-N-logic true-single-phase (TSP) CMOS dynamic logic circuit as shown in FIG. 3a and the rise time of N-block of the TSP CMOS dynamic logic circuit using the n-p-n-p configuration as shown in FIG. 2a. FIG. 5b shows the fall time of the N2-block vs. fan-in of the 1.5 V boostrapped all-N-logic true-single-phase (TSP) CMOS dynamic logic circuit as shown in FIG. 3a and the fall time of P-block of the TSP CMOS dynamic logic circuit using the n-p-n-p configuration as shown in FIG. 2a. For a larger fan-in to the N1-block, the rise time is larger. As shown in FIG. 5a, the rise time of the boostrapped N1-block is similar to that of the N-block without the bootstrap circuit. From FIG. 5b, the influence of the N1-block bootstrap circuit in the fall time of the N2-block can be seen. With a bootstrap circuit, the output voltage of the N1-block may surpass $V_{dd}$ during its logic evaluation. During the following logic evaluation period of the N2-block, the boosted output voltage of the N1-block can greatly enhance the fall time of the N2-block. This is especially noticeable for a large fan-in to the N2-block.

Discussion

Figure 6A:
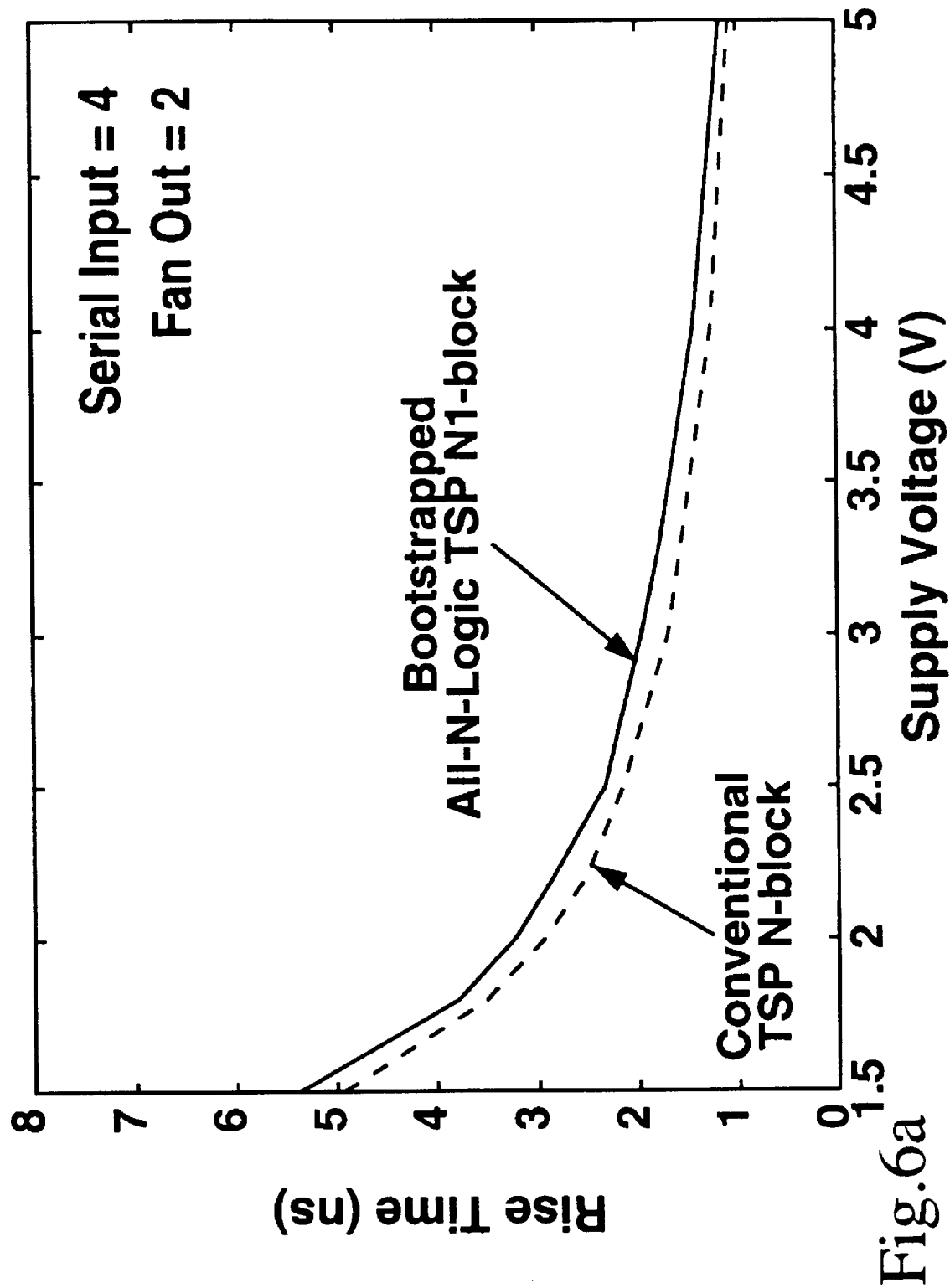
Figure 6B:
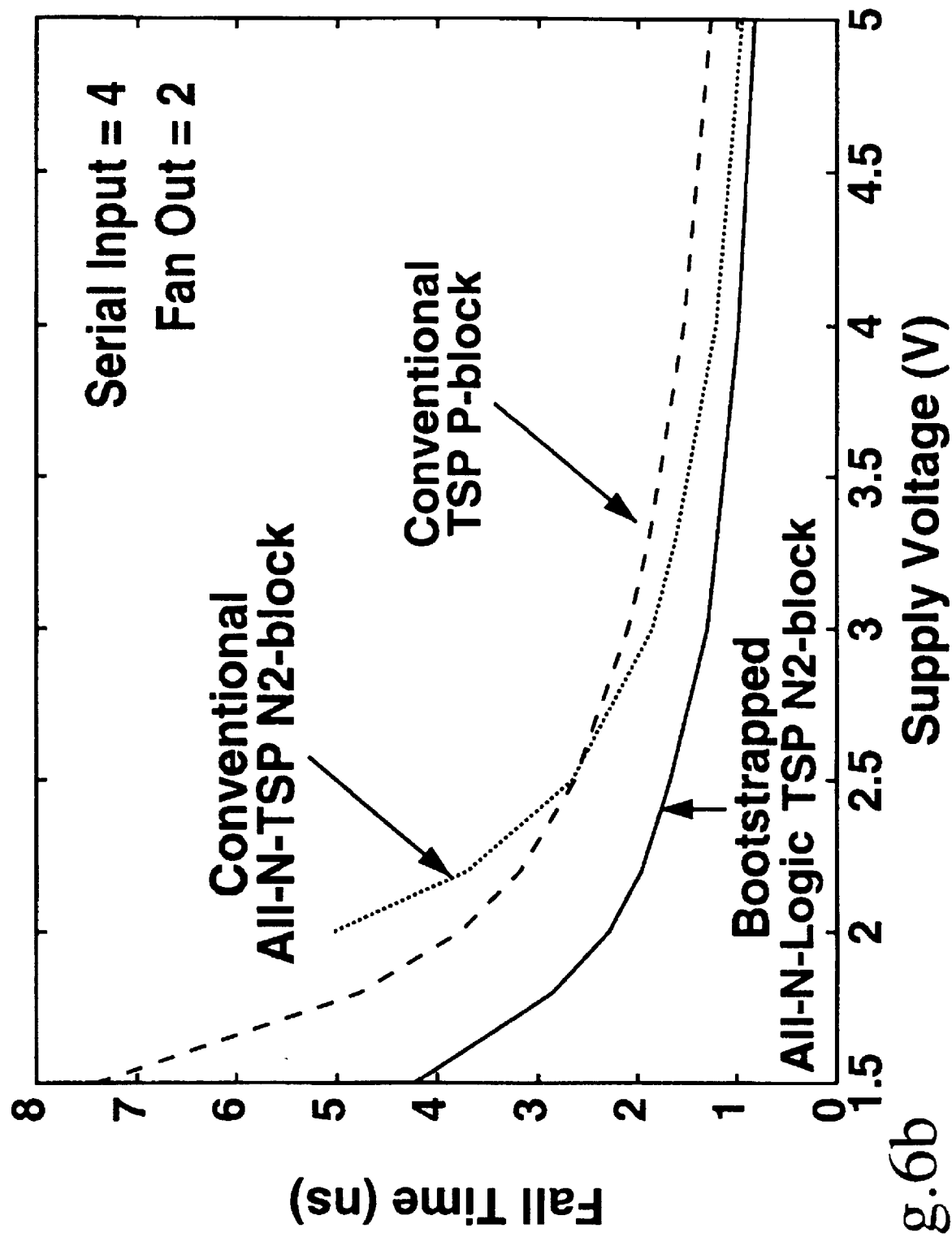

The speed performance of the bootstrapped all-N-logic true-single-phase CMOS dynamic logic circuit is especially advantageous in an operation environment with a down-scaled supply voltage. FIG. 6a shows the rise time of the N1-block vs. supply voltage of the 1.5 V all-N-logic true-single-phase (TSP) CMOS dynamic logic circuit in comparison with the rise time of the N-block of the TSP CMOS dynamic logic circuit using the n-p-n-p configuration as shown in FIG. 2a. FIG. 6b shows the fall time of the N2-block vs. supply voltage of the 1.5 V all-N-logic truesingle-phase (TSP) CMOS dynamic logic circuit with and without the bootstrap circuit as shown in FIG. 3, and the fall time of the P-block vs. supply voltage of TSP dynamic CMOS logic circuit using the n-p-n-p configuration as shown in FIG. 2a. As shown in FIG. 6a, the rise time of the two circuits is similar. The bootstrap circuit of the N1-block does not help shrink the rise time. On the other hand, as shown in FIG. 6b, the fall time of the N2-block in the all-N-logic TSP CMOS dynamic logic circuit is very sensitive to the supply voltage when $V_{dd}$ is smaller than 2.5 V. Under 2 V, it can not function correctly. Although the conventional TSP CMOS dynamic logic circuit in the n-p-n-p configuration can function with $V_{dd}$ below 2 V, its fall time is much longer than that of the bootstrapped all-N-logic TSP CMOS dynamic logic circuit. The much better fall time of the bootstrapped all-N-logic TSP CMOS dynamic logic circuit is owing to the bootstrapped N1-block output.

In this invention, a 1.5 V true-single-phase dynamic logic circuit using all-N-logic and bootstrapped circuit techniques for high speed operation with a low supply voltage has been presented. Based on the study, the speed performance of this bootstrapped all-N-logic true-single-phase CMOS dynamic logic circuit is 75% faster at a supply voltage of 1.5 V as compared to the conventional true-single-phase dynamic logic circuit.

What is claimed is:

1. In a non-inverting all-N-logic true-single-phase CMOS dynamic circuit for operation in response to receiving a single-phase clock signal, comprising a) a first PMOS transistor (MNP) having a gate terminal, a drain terminal and a source terminal, said source terminal being connected to a positive power ($V_{dd}$), and said gate terminal being connected to a source of said single-phase clock signal (CK);

b) a second PMOS transistor (MBP1) having a gate terminal, a drain terminal and a source terminal, said gate terminal being connected to the drain terminal of said first PMOS transistor (MNP);

c) a first NMOS transistor (MNN) having a gate terminal, a drain terminal and a source terminal, said source terminal being earthed, and said gate terminal being connected to said source of said single-phase clock signal;

d) N logic switch means connected to the drain terminal of said first PMOS transistor (MNP) and the drain terminal of said first NMOS transistor (MNN), for selectively connecting and disconnecting said drain terminal of said first PMOS transistor and said drain terminal of said first NMOS transistor;

e) a second NMOS transistor (MLN1) having a gate terminal, a drain terminal and a source terminal, said source terminal being earthed or connected to the drain terminal of said first NMOS transistor (MNN), and said gate terminal being connected to the drain terminal of said first PMOS transistor (MNP); and f) a third NMOS transistor (NCN1) having a gate terminal, a drain terminal and a source terminal, said source terminal being connected to the drain terminal of said second NMOS transistor (MLN1), said gate terminal being connected to said source of said single-phase clock signal, and said drain terminal being connected to the drain terminal of said second PMOS transistor (MBP1) and an output terminal;

the improvement comprising a bootstrap circuit being connected to said drain terminal of said first PMOS transistor (MNP), said positive Power ($V_{dd}$) and said source terminal of said second PMOS transistor (MBP1), wherein said bootstrap circuit consisting essentially of:

g) a capacitor device ($C_b$) having a bottom plate and a top plate;

h) an inverter having an input terminal and output terminal; and i) a third PMOS transistor (MLP1) having a gate terminal, a drain terminal and a source terminal, wherein
said source terminal of said third PMOS transistor (MLP1) is connected to said positive power ($V_{dd}$);
said input terminal of said inverter is connected to said drain terminal of said first PMOS transistor (MNP);
said drain terminal of said third PMOS transistor (MLP1) and said source terminal of said second PMOS transistor (MBP1) are both connected to said bottom plate of said capacitor device; and
said gate terminal of said third PMOS transistor (MLP1) and said top plate of said capacitor device are both connected to said output terminal of said inverter.

2. The non-inverting all-N-logic true-single-phase CMOS dynamic circuit according to claim 1, wherein said capacitor device is a fourth PMOS transistor having a drain terminal, a source terminal and a gate terminal, the drain terminal and source terminal of said fourth PMOS transistor being connected with each other, wherein the connected drain terminal and source terminal of said fourth PMOS transistor are connected to said drain terminal of said third PMOS transistor (MLP1) and to said source terminal of said second PMOS transistor (MBP1) as said bottom plate, and said gate terminal of said fourth PMOS transistor is connected to said output terminal of said inverter as said top plate of said capacitor device.

* * * * *